United States Patent
Tsushima et al.

(10) Patent No.: US 7,563,502 B2
(45) Date of Patent: Jul. 21, 2009

(54) FINE CARBON FIBER-METAL COMPOSITE MATERIAL AND METHOD FOR PRODUCTION THEREOF

(75) Inventors: Eiki Tsushima, Fuji (JP); Kazuyuki Murakami, Fuji (JP); Susumu Katagiri, Chiyoda-ku (JP)

(73) Assignees: Mitsubishi Corporation, Tokyo (JP); FJ Composite Materials Co., Ltd., Fuji-shi (JP)

( * ) Notice: Subject to any disclaimer, the term of this patent is extended or adjusted under 35 U.S.C. 154(b) by 52 days.

(21) Appl. No.: 11/630,681

(22) PCT Filed: Jun. 2, 2005

(86) PCT No.: PCT/JP2005/010194

§ 371 (c)(1),
(2), (4) Date: Dec. 27, 2006

(87) PCT Pub. No.: WO2006/003773

PCT Pub. Date: Jan. 12, 2006

(65) Prior Publication Data

US 2008/0050589 A1     Feb. 28, 2008

(30) Foreign Application Priority Data

Jul. 6, 2004     (JP) .............................. 2004-199487

(51) Int. Cl.
*B32B 27/04* (2006.01)
(52) U.S. Cl. ................. 428/297.4; 428/408; 423/447.1; 423/447.3; 423/445 R
(58) Field of Classification Search ............... 428/297.4, 428/408, 447.1, 447.2, 447.3, 445 R
See application file for complete search history.

(56) References Cited

U.S. PATENT DOCUMENTS

| | | | | |
|---|---|---|---|---|
| 5,547,748 A | * | 8/1996 | Ruoff et al. ................. | 428/323 |
| 6,649,265 B1 | * | 11/2003 | Kawamura et al. .......... | 428/408 |
| 6,916,434 B2 | * | 7/2005 | Nishino et al. .............. | 252/503 |
| 7,090,819 B2 | * | 8/2006 | Smalley et al. ............ | 423/447.6 |
| 2002/0121460 A1 | * | 9/2002 | Moy et al. .................. | 208/133 |

(Continued)

FOREIGN PATENT DOCUMENTS

JP     1 279721     11/1989

(Continued)

OTHER PUBLICATIONS

U.S. Appl. No. 11/630,887, filed Dec. 27, 2006, Tsushima et al.

(Continued)

*Primary Examiner*—N. Edwards
(74) *Attorney, Agent, or Firm*—Oblon, Spivak, McClelland, Maier & Neustadt, P.C.

(57) ABSTRACT

To provide a fine carbon fiber/metal composite material having high mechanical strength, a high thermal conductivity and a low coefficient of thermal expansion and suitable as a substrate for an electronic device.

A fine carbon fiber/metal composite material, which is prepared by pressure impregnating a molded product containing fine carbon fibers having a fiber diameter of from 0.5 to 500 nm and a fiber length of at most 1,000 μm, having a multilayer structure wherein cylindrical carbon layers overlap one another, and having a hollow-structured central axis, with aluminum, magnesium, copper or an alloy of such a metal, by molten metal forging.

12 Claims, 1 Drawing Sheet

U.S. PATENT DOCUMENTS

| | | | |
|---|---|---|---|
| 2006/0142149 A1* | 6/2006 | Ma et al. | 502/185 |
| 2007/0042901 A1* | 2/2007 | Kurose et al. | 502/180 |
| 2007/0053166 A1* | 3/2007 | Hwang et al. | 361/717 |
| 2008/0002619 A1* | 1/2008 | Tujkovic et al. | 370/330 |
| 2008/0003426 A1* | 1/2008 | Tsushima et al. | 428/332 |
| 2008/0031803 A1* | 2/2008 | Yano et al. | 423/447.2 |
| 2008/0050589 A1* | 2/2008 | Tsushima et al. | 428/376 |

FOREIGN PATENT DOCUMENTS

| | | |
|---|---|---|
| JP | 11 97593 | 4/1999 |
| JP | 2004 10978 | 1/2004 |
| JP | 2005 48206 | 2/2005 |

OTHER PUBLICATIONS

U.S. Appl. No. 11/630,681, filed Dec. 27, 2006, Tsushima et al.

U.S. Appl. No. 11/631,106, filed Dec. 28, 2006, Tsushima et al.

U.S. Appl. No. 11/574,767, filed Mar. 6, 2007, Tsushima et al.

* cited by examiner

FINE CARBON FIBER-METAL COMPOSITE MATERIAL AND METHOD FOR PRODUCTION THEREOF

TECHNICAL FIELD

The present invention relates to a fine carbon fiber/metal composite material having a high thermal conductivity, a low coefficient of thermal expansion and a low elastic modulus, and its production process.

BACKGROUND ART

For example, along with tendency toward high functionality and large capacity of electronic devices, generation of heat is increasing, and a material having a high thermal conductivity and a low coefficient of thermal expansion useful for heat removal has been required. Most of heat generated from an electronic circuit comprising a semiconductor device, a resistor, a transformer, a condenser and a wiring is transmitted from a circuit board or a base substrate as a support for the circuit board to a cooling device and is finally released to the air or a cooling liquid. In an electronic circuit which generates a large quantity of heat, aluminum, copper or an alloy thereof having good thermal conductivity is usually used for the material of the base substrate.

Further, in recent years, a heat-transfer material having a coefficient of thermal expansion adjusted low by combining carbon fibers or a ceramic with a metal has been proposed (for example, Patent Document 1). However, although aluminum, copper or an alloy thereof used for the material of the base substrate has good thermal conductivity, it has a large coefficient of thermal expansion in its nature. Whereas, an electronic circuit comprising a ceramic or a silicon semiconductor device to be laminated on the base substrate has a low coefficient of thermal expansion, and accordingly by the difference in thermal expansion between them, warpage, peeling or the like may occur.

As a material which solves the above problem, a substrate made of a composite material comprising silicon carbide, alumina, silicon nitride or aluminum nitride as a ceramic having a low coefficient of thermal expansion and alumina or copper metal, has been proposed. However, this composite material substrate has such a drawback that its processing is difficult since it contains a ceramic. Further, a substrate comprising silicon and an aluminum alloy has also been proposed but has not been used practically yet.

As mentioned above, heretofore, proposed materials may satisfy both thermal conductivity and coefficient of thermal expansion, but no material with favorable processability has been realized yet. Further, many of conventional materials have a high elastic modulus, and accordingly when materials differing in the coefficient of thermal expansion are bonded, a large thermal stress is applied to the bonding surface and as a result, peeling or the like may occur.

Patent Document 1: JP-A-11-97593

DISCLOSURE OF THE INVENTION

Object to be Accomplished by the Invention

Under these circumstances, it is an object of the present invention to provide a material suitable for e.g. a heat dissipating material for a substrate for electronic devices, which is light in weight and has a high thermal conductivity and high mechanical strength, which has a coefficient of thermal expansion which agrees with that of an electronic circuit and which has favorable machinability.

Means to Accomplish the Object

The present inventors have conducted extensive studies to achieve the above object and as a result, found that the above object can be accomplished by a carbon fiber/metal composite material which is prepared by using fine carbon fibers having specific physical properties and pressure impregnating a molded product containing the fine carbon fibers with a specific metal by molten metal forging, and accomplished the present invention.

Namely, the present invention provides the following.

(1) A fine carbon fiber/metal composite material, which is prepared by pressure impregnating a molded product containing fine carbon fibers having a fiber diameter of from 0.5 to 500 nm and a fiber length of at most 1,000 μm and having a hollow-structured central axis, with aluminum, magnesium, copper or an alloy of such a metal, by molten metal forging.

(2) The fine carbon fiber/metal composite material according to the above (1), wherein the volume fraction of the fine carbon fibers is from 20 to 70%.

(3) The fine carbon fiber/metal composite material according to the above (1) or (2), which has a thermal conductivity of at least 150 W/(m·K) in a thickness direction, a coefficient of thermal expansion of from $4 \times 10^{-6}/°C$. to $20 \times 10^{-6}/°C$. and an elastic modulus of from 20 to 70 GPa in a plane direction.

(4) The fine carbon fiber/metal composite material according to any one of the above (1) to (3), wherein the fine carbon fibers are fine carbon fibers covered with a phenolic resin, the surface of which is covered with a phenolic resin in an amount of from 1 to 40 parts by weight per 100 parts by weight of the fine carbon fibers.

(5) A process for producing a fine carbon fiber/metal composite material, which comprises pre-heating a molded product containing fine carbon fibers having a fiber diameter of from 0.5 to 500 nm and a fiber length of at most 1,000 μm and having a hollow-structured central axis in an inert atmosphere, and then pressure impregnating the molded product with a molten metal of aluminum, magnesium, copper or an alloy of such a metal by molten metal forging by using a pressing apparatus under a pressure of at least 20 MPa per unit area of a punch.

(6) The process for producing a fine carbon fiber/metal composite material according to the above (5), wherein the molded product containing fine carbon fibers is a molded product obtained by pressurizing and heating a mixture containing 100 parts by weight of the fine fibers, at least 10 parts by weight of a powder of the same metal as the metal with which the molded product is to be pressure impregnated, or an alloy of such a metal, and a binder.

(7) The process for producing a fine carbon fiber/metal composite material according to the above (5) or (6), wherein the fine carbon fibers are fine carbon fibers covered with a phenolic resin, the surface of which is covered with a phenolic resin in an amount of from 1 to 40 parts by weight per 100 parts by weight of the fine carbon fibers.

Effects of the Invention

The thermal conductivity of the fine carbon fiber/metal composite material of the present invention increases by up to 100 W/(m·K) from that of the molded product before impregnation. Further, with respect to the coefficient of thermal expansion, one having an optional value within a range of from $4 \times 10^{-6}/°C$. to $20 \times 10^{-6}/°C$. can be produced by changing the type of the fine carbon fibers or the metal. This coefficient of thermal expansion is, when the fine carbon fiber/metal composite material of the present invention is used as a substrate for an electronic circuit, the coefficient of thermal expansion of from 3 to $10^{-6}/°$ C. to $4\times10^{-6}/°$ C. of silicon, from $4.5\times10^{-6}/°$ C. of aluminum nitride or from $7\times10^{-6}/°$ C. to $8\times10^{-6}/°$ C. of alumina, to be mounted on the substrate. Further, as the elastic modulus of the substrate is small, the thermal stress applied to the bonding layer and the bonding interface can be reduced. Accordingly, by use of the fine carbon fiber/metal composite material substrate of the present invention as a substrate, the thermal stress caused by the difference in thermal expansion between the substrate and an electronic equipment mounted thereon is reduced, whereby drawbacks such as peeling can be suppressed.

Further, by the fine carbon fiber/metal composite material having the above structure, the nature of a fragile carbon material can be improved, and a substrate for an electronic device excellent in strength can be obtained. Particularly in mechanical processing, cracks or breakage of the material is less likely to occur, whereby processing will be easy, and products with high accuracy of fishing will be obtained.

MEANINGS OF SYMBOLS

Figure 1:
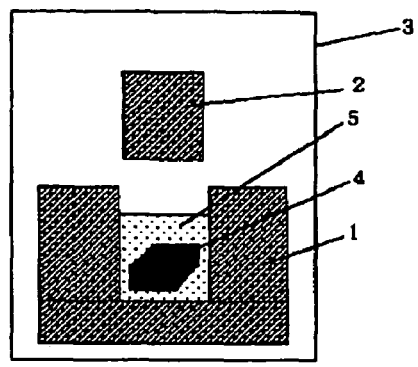
FIG. 1 is a view schematically illustrating one example of a production apparatus used for production of the fine carbon fiber/metal composite material of the present invention.

1: Mold
2: Punch
3: Pressing machine
4: Carbon molded product
5: Molten metal
5': Solid

BEST MODE FOR CARRYING OUT THE INVENTION

The fine carbon fibers used in the present invention are fine carbon fibers having a fiber diameter of from 0.5 to 500 nm and a fiber length of at most 1,000 μm and preferably having an aspect ratio of from 3 to 1,000, preferably having a multilayer structure having cylinders comprising a carbon hexagonal plane concentrically disposed and having a hollow-structured center axis. Such fine carbon fibers are greatly different from conventional carbon fibers having a fiber diameter of from 5 to 15 μm, obtainable by subjecting conventional fibers such as PAN, pitch, cellulose or rayon to heat treatment. The fine carbon fibers used in the present invention are greatly different from conventional carbon fibers not only in the fiber diameter and the fiber length but also in the structure. As a result, very excellent physical properties such as electrical conductivity, thermal conductivity and sliding properties are achieved.

If the fiber diameter of the fine carbon fibers is smaller than 0.5 nm, the strength of the composite material to be obtained will be insufficient, and if it is larger than 500 nm, mechanical strength, thermal conductivity, sliding properties, etc. will be low. Further, if the fiber length is longer than 1,000 μm, the fine carbon fibers are hardly dispersed uniformly in the matrix such as aluminum metal, whereby the composition of the material tends to be non-uniform, and the composite material to be obtained tends to have low mechanical strength. The fine carbon fibers used in the present invention are particularly preferably ones having a fiber diameter of from 10 to 200 nm and a fiber length of from 3 to 300 μm, and preferably an aspect ratio of from 3 to 500. In the present invention, the fiber diameter and the fiber length of the fine carbon fibers can be measured by an electron microscope.

Preferred fine carbon fibers used in the present invention are carbon nanotubes. The carbon nanotubes are also called graphite whisker, filamentous carbon, carbon fibrils or the like, and they are classified into single layer carbon nanotubes comprising a single graphite layer forming the tube and multilayer carbon nanotubes comprising a plurality of layers, and both can be used in the present invention. However, multilayer carbon nanotubes are preferred, with which high mechanical strength will be obtained and which are advantageous in economical viewpoint.

Carbon nanotubes are produced by e.g. arc discharge, laser vaporization or heat decomposition, for example, as disclosed in "Fundamentals of Carbon Nanotubes" (published by CORONA PUBLISHING CO., LTD., pages 23 to 57, 1998). The carbon nanotubes are ones having a fiber diameter of preferably from 0.5 to 500 nm, a fiber length of preferably from 1 to 500 μm and preferably an aspect ratio of from 3 to 500.

Particularly preferred fine carbon fibers in the present invention are vapor grown carbon fibers having relatively large fiber diameter and fiber length among the above carbon nanotubes. Such vapor grown carbon fibers are also called VGCF, and produced by vapor phase heat decomposition of a gas of e.g. a hydrocarbon together with a hydrogen gas in the presence of an organic transition metal type catalyst, as disclosed in JP-A-2003-176327. The vapor grown carbon fibers (VGCF) have a fiber diameter of preferably from 50 to 300 nm, a fiber length of preferably from 3 to 300 μm, and preferably have an aspect ratio of from 3 to 500. The VGCF are excellent in view of productivity and handling efficiency.

The fine carbon fibers used in the present invention are preferably subjected to heat treatment at a temperature of at least 2,300° C., preferably from 2,500 to 3,500° C. in a non-oxidizing atmosphere, whereby the surface will be graphitized, and the mechanical strength and the chemical stability will greatly improve, and the composite material to be obtained will be light in weight. As the non-oxidizing atmosphere, an argon, helium or nitrogen gas is preferably used. In a case where in this heat treatment, a boron compound such as boron carbide, boron oxide, boron, a borate, boron nitride or an organic boron compound coexists, the above effects by the heat treatment will further improve and further, the heat treatment temperature will be reduced, and the heat treatment will be advantageously carried out. Such a boron compound is present preferably with a boron content of from 0.01 to 10 mass %, preferably from 0.1 to 5 mass % in the heat treated fine carbon fibers.

In the present invention, the fine carbon fiber/metal composite material is produced by bringing the molding product containing the fine carbon fibers into contact with the molten metal under elevated pressure so that the molded product is pressure impregnated with the molten metal by molten metal forging. The molded product containing the fine carbon fibers is produced by pressure molding the fine carbon fibers preferably by using a binder such as pitch, a phenolic resin, a furan resin, an epoxy resin or a mixture thereof by means of uniaxial molding, A/C molding or the like preferably with heating at from 100 to 250° C.

The shape of the molded produce varies depending upon the purpose of use, and a suitable shape such as a plate, a disk, a prism, a cylinder, a column, a rectangular solid or a sphere may be employed. Among them, usually a plate which is easily molded and which is widely applicable, is employed. For example, as a substrate for an electronic device, the thickness is preferably from 0.1 mm to 100 mm, particularly preferably from 0.3 mm to 3 mm. The molded product preferably has a density of from 1.4 g/cm$^3$ to 2 g/cm$^3$ and a porosity of at most 50%, preferably at most 35%, furthermore preferably at most 25%.

In production of the molded product containing the fine carbon fibers, the fine carbon fibers may be used as they are, but use of fine carbon fibers, the surface of which is covered with a phenol resin, is preferred. When such fine carbon fibers covered with a resin are used, the dispersed state will be uniform, and a fine carbon fiber/metal composite material having excellent characteristics will be obtained. The amount of the phenolic resin with which the surface of the fine carbon fibers is covered is preferably from 1 to 40 parts by weight, particularly preferably from 5 to 25 parts by weight per 100 parts by weight of the fine carbon fibers. The fine carbon fibers covered with a phenol resin can be produced by reacting a phenol and an aldehyde while they are mixed with the fine carbon fibers in the presence of a catalyst.

Further, in production of the molded product containing the fine carbon fibers, it is preferred to mix the fine carbon fibers with a powder of the same metal as the metal with which the molded product is to be impregnated in the subsequent step or an alloy thereof and to mold the mixture, whereby impregnation in the metal impregnation step will be remarkably improved. The amount of the above powder of the metal or the alloy thereof is preferably from 10 to 40 parts by weight, particularly preferably from 30 to 40 parts by weight per 100 parts by weight of the fine carbon fibers. Further, the powder of the metal or the alloy thereof has an average particle size of preferably from 0.5 to 150 μm, particularly preferably from 2 to 100 μm.

The molded product containing the fine carbon fibers is then brought into contact with the molten metal under elevated pressure, so that the carbon molded product is pressure impregnated with the molten metal by molten metal forging. The metal with which the molded product is impregnated varies depending upon the purpose of use and the type of the composite material to be obtained, and aluminum, magnesium, copper or an alloy of such a metal is used.

In the present invention, when the composite material is used for e.g. an electronic device, aluminum or copper is preferably used. Further, as an alloy, aluminum containing silicon preferably in an amount of at most 12 wt % is used to improve impregnation properties.

In the pressure impregnation with a metal by molten metal forging, first, in step (1), the molded product is disposed in a mold and pre-heated in an inert atmosphere. As the inert atmosphere, an argon gas, a nitrogen gas or the like, preferably an argon gas may be used. Further, the pre-heating is carried out by holding the molded product at a temperature of the melting point of the metal component or higher, preferably at a temperature higher by at least 100° C. than the melting point, particularly preferably at a temperature higher by from 100 to 150° C. than the melting point. By means of this step (1), the metal can be sufficiently infiltrated into pores of the molded product of the fine carbon fibers while the reaction at the interface between carbon and the metal is suppressed.

Then, in step (2), the metal component is melted at a temperature higher than the melting point of the metal component preferably by from 50 to 250° C., the molten metal is supplied to the mold and brought into contact with the above pre-heated molded product, and the molten metal is pressurized by a punch using a pressing apparatus under a pressure of at least 20 MPa, preferably from 20 to 100 MPa per area of the punch, so that the molded product is pressure impregnated with the molten metal by molten metal forging. In step (2), in the case of aluminum, if the temperature of the molten metal exceeds a temperature higher by 150° C. than the melting point, deliquescent aluminum carbide is likely to form, and no practical composite material will be obtained. Further, if the pressure does not reach 20 MPa, impregnation with the metal component will not efficiently be carried out, and the metal filling rate may decrease.

A preferred apparatus used for the above molten metal forging in the present invention comprises a main mold having a space in its inside and a punch, and has such a structure that the punch is closely contacted to inner walls of the opening of the main mold, freely moves toward the inside and outside directions and is movable toward the inside direction by pressurizing. The molten metal forging system may, for example, be an open-mold system shown in FIG. 2 i.e. a direct pressurizing system or a closed-mold system (indirect pressuring system) shown in FIG. 3.

Figure 2:
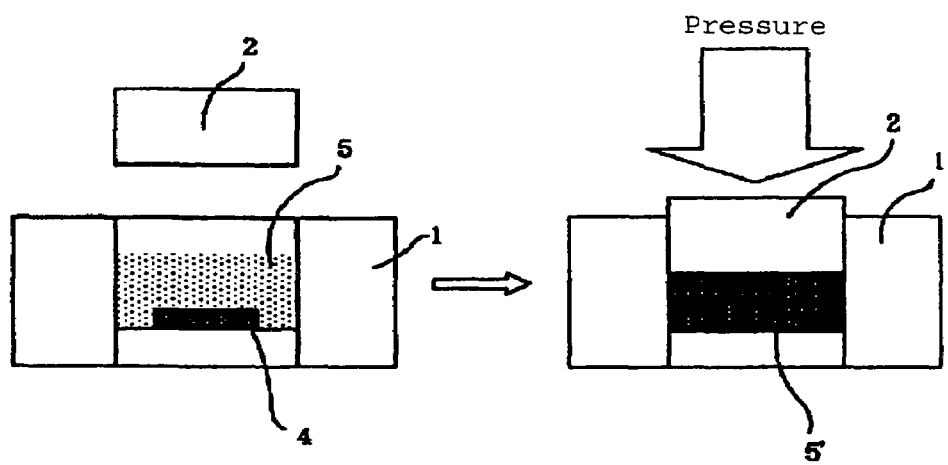
FIG. 2 is a view schematically illustrating another example of a production apparatus used for production of the fine carbon fiber/metal composite material of the present invention.
Figure 3:
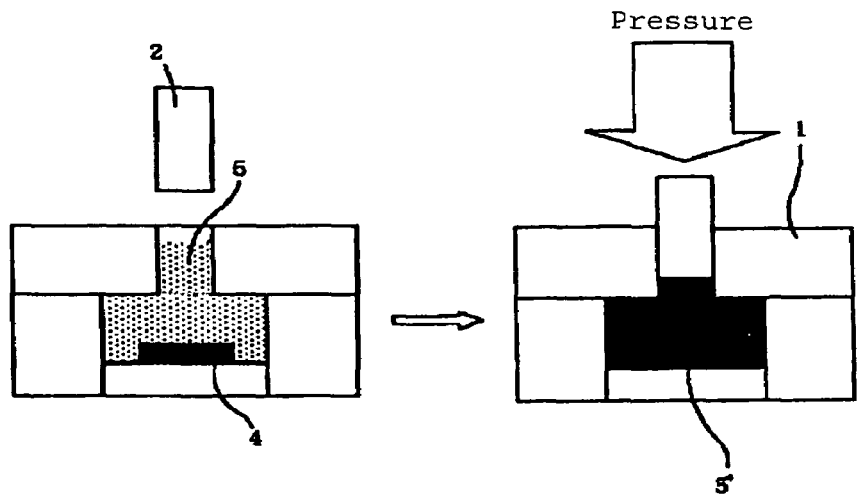
FIG. 3 is a view schematically illustrating another example of a production apparatus used for production of the fine carbon fiber/metal composite material of the present invention.

Specific examples of apparatuses used in the process for producing a fine carbon fiber/metal composite material of the present invention are shown in FIGS. 1 to 3. In FIGS. 1 to 3, the numerical reference 1 designates a mold, 2 a punch and 3 a pressing machine. A carbon molded product 4 is put in the mold 1 and pre-heated in an argon gas, and then a molten metal heated at a predetermined temperature is supplied, and the molten metal in the mold is pressurized by the punch 3 and maintained under the same conditions for a predetermined time. After a lapse of the predetermined time, a metal solidified product is taken out from the mold together with the block of the metal, and the metal portion is removed by cutting, dissolution or another method to obtain a carbon fiber/metal composite material.

The volume fraction of the fine carbon fibers contained in the fine carbon fiber/metal composite material of the present invention thus produced is preferably from 20 to 70%, particularly preferably from 25 to 65%. If the volume fraction is smaller than 20%, characteristics of the composite material to be obtained tend to be low, and on the contrary, if it is larger than 70%, uniform impregnation tends to be difficult. The volume fraction is the percentage of the volume of the fine carbon fibers based on the volume of the fine carbon fiber/metal composite material.

The fine carbon fiber/metal composite material of the present invention has high mechanical strength, a high thermal conductivity and a low elastic modulus and is thereby suitably used particularly for a circuit board for an electronic device, a support substrate therefor, etc. In such a case, as the composite material has a thermal conductivity of at least 150 W/(m·K) and a coefficient of thermal expansion of from $4 \times 10^{-6}$/° C. to $20 \times 10^{-6}$/° C., problems of the conventional substrate material are solved. Further, the molded product of the carbon fiber/metal composite material of the present invention has an elastic modulus in a plane direction within a range of from 20 to 70 GPa, and accordingly when a material differing in the thermal conductivity is bonded, the thermal stress applied to the bonding layer can be reduced. Accordingly, bonding resistant to peeling or heat cycles is possible.

The carbon fiber/metal composite material of the present invention for an electronic device is preferably one having a density of at least 2 g/cm$^3$. Specifically, a fine carbon fiber/metal composite material containing aluminum or an aluminum alloy is preferably one having a density of from 2.0 g/cm$^3$ to 2.5 g/cm$^3$, and a fine carbon fiber/metal composite material containing copper or a copper alloy is preferably one having a density of from 2.3 g/cm$^3$ to 5.0 g/cm$^3$.

Further, the fine carbon fiber/metal composite material of the present invention has a specific elastic modulus in addition to the above thermal conductivity and coefficient of thermal expansion, and has an elastic modulus in a plane direction within a range of at most 50 GPa, preferably from 3 GPa to 15 GPa. By such a controlled property, when the composite material is used as a substrate for an electronic circuit, the bonding between the base substrate and an electronic circuit comprising a silicon device or a ceramic will not undergo peeling and will be resistant to a thermal cycle test.

The present invention has been described above with respect to a case where the fine carbon fiber/metal composite material of the present invention is used as a material particularly in the field of electronic devices, but the fine carbon fiber/metal composite material of the present invention is not limited thereto, and is useful as a material in a wide range of fields, such as an industrial member which is required to have heat resistance, light weight properties, rigidity, etc.

EXAMPLES

Now, the present invention will be described in further detail with reference to Examples and Comparative Examples, but the present invention is by no means restricted to such specific Examples. For evaluation of the quality and performance of the fine carbon fiber/metal composite material prepared in Examples and Comparative Examples, the following measurement methods were employed.

Density: Measured by means of Archimedes' principle by using an electronic analytical balance AEL-200 manufactured by Shimadzu Corporation.

Bending strength: Bending strength was measured with respect to a prepared strength test specimen by using a precision universal testing apparatus AG-500 manufactured by Shimadzu Corporation. Measurement was carried out under conditions with a test specimen size of 4 mm×4 mm×8 mm with a span of 60 mm at a cross head speed of 0.5 mm/min.

Thermal conductivity: Determined as a product of the thermal diffusivity, the specific heat and the density. The thermal diffusivity was measured by means of laser flash method by using TC-7000 manufactured by ULVAC RIKO INC. at 25° C. Further, as the irradiation beam, a ruby laser beam (excitation voltage: 2.5 kv, one homogenizing filter and one excitation filter) was used.

Coefficient of thermal expansion: The coefficient of thermal expansion from room temperature to 300° C. was measured by using a thermal analyzer 001, TD-5020 manufactured by Mac Science Co., Ltd.

Elastic modulus: Determined by calculation from stress-strain data in the strength test.

Example 1

A mixture of fibers comprising 100 parts by weight of fine carbon fibers having a fiber diameter of 150 nm, a fiber length of 4.5 μm and an aspect ratio of 30, obtained by treating vapor grown carbon fibers in an argon atmosphere at a temperature of 2,800° C. for 30 minutes, covered with 15 parts by weight of a phenolic resin, 20 parts by weight of a pure aluminum powder (average particle size: 20 μm) and 3 parts by weight of a phenolic resin powder (trade name: LA-100P, manufactured by LIGNYTE CO., LTD.) was cured and molded under conditions at 150° C. for 30 minutes by using a uniaxial molding machine under a pressure of 200 Kg/M$^2$ to produce a plate-shaped molded product (length: 100 mm, width: 100 mm, thickness: 15 mm).

Here, the above fine carbon fibers were prepared as follows. 20 Parts by weight of bisphenol A (solubility in water at room temperature: 0.036), 365 parts by weight of phenol, 547 parts by weight of 37 wt % formalin and 7.7 parts by weight of triethylamine were charged in a reaction container. Then, 1,835 parts by weight of fine carbon fibers graphitized by subjecting vapor grown carbon fibers having a fiber diameter of 150 nm, a fiber length of 15 μm and an aspect ratio of 30 in an argon gas atmosphere at a temperature of 2,800° C. for 30 minutes, and 1,500 parts by weight of water were charged (amount of hydrophobic bisphenol A: 5 wt % of phenols). The temperature was raised to 90° C. over a period of 60 minutes while the mixture was stirred, and reaction was carried out as it was for 4 hours. Then, after cooling to 20° C., the content in the reaction container was collected by filtration using a Buchner funnel to obtain fine carbon fibers having a water content of 22 wt %. The fibers were dried in a circulating hot air dryer at a temperature in a dryer of 45° C. for about 48 hours to obtain fine carbon fibers covered with a phenolic resin having a phenolic resin content of 15 wt %.

The plate-shaped molded product was pre-heated in an argon gas at 760° C. and disposed in a mold pre-heated at 500° C. Pure aluminum melted at 810° C. was put in the mold. The molten aluminum was pressurized by a pressing machine under a pressure of 50 MPa per pressing area of a punch by molten metal forging, and maintained in such a state for 30 minutes. After cooling, the molded product was taken out together with the block of aluminum, followed by cutting to obtain a fine carbon fiber/metal composite material.

The fine carbon fiber/metal composite material had a density of 2.34, a thermal conductivity of 300, a coefficient of linear expansion of 10×10$^{-6}$, an elastic modulus of 55 GPa and a bending strength of 250 MPa.

INDUSTRIAL APPLICABILITY

The fine carbon fiber/metal composite material of the present invention is light in weight, has a high thermal conductivity, has high mechanical strength, has a coefficient of thermal expansion which agrees with that of an electronic circuit and has favorable machinability, and is thereby utilizable for various fields. Particularly, it is suitably used as e.g. a circuit board for an electronic device.

The invention claimed is:

1. A fine carbon fiber/metal composite material, comprising a fine carbon fiber/metal composite material prepared by pressure impregnating a molded product containing fine carbon fibers having a fiber diameter of from 0.5 to 500 nm and a fiber length of at most 1,000 μm and having a hollow-structured central axis, with aluminum, magnesium, copper, silver or an alloy of such a metal, by molten metal forging, wherein the fine carbon fibers are covered with a phenolic resin, wherein the surface of the fine carbon fibers is covered with the phenolic resin in an amount of from 1 to 40 parts by weight per 100 parts by weight of the fine carbon fibers, and the volume fraction of the fine carbon fibers in the fine carbon fiber/metal composite material is from 20 to 70%, and which has a thermal conductivity of at least 150 W/(m·K) in a thickness direction, a coefficient of thermal expansion of from $4\times10^{-6}$/°C. to $20\times10^{-6}$/°C. and an elastic modulus of from 20 to 70 GPa in a plane direction.

2. The fine carbon fiber/metal composite material according to claim 1, wherein the fine carbon fibers having a fiber diameter of from 10 to 200 nm.

3. The fine carbon fiber/metal composite material according to claim 1, wherein the fine carbon fibers have a fiber length of 3 to 300 μm.

4. The fine carbon fiber/metal composite material according to claim 1, wherein the fine carbon fibers have an aspect ratio of 3 to 500.

5. The fine carbon fiber/metal composite material according to claim 1, wherein the fine carbon fibers are carbon nanotubes.

6. The fine carbon fiber/metal composite material according to claim 5, wherein the carbon nanotubes are multilayer carbon nanotubes.

7. The fine carbon fiber/metal composite material according to claim 1, prepared by pressure impregnating a molded product containing fine carbon fibers having a fiber diameter of from 0.5 to 500 nm and a fiber length of at most 1,000 μm and having a hollow-structured central axis, with aluminum, copper, or an alloy of such a metal.

8. The fine carbon fiber/metal composite material according to claim 1, prepared by pressure impregnating a molded product containing fine carbon fibers having a fiber diameter of from 0.5 to 500 nm and a fiber length of at most 1,000 μm and having a hollow-structured central axis, with an alloy of aluminum and silicon.

9. The fine carbon fiber/metal composite material according to claim 1, which has a density of at least 2 g/cm³.

10. The fine carbon fiber/metal composite material according to claim 1, which has a density of 2.0 to 2.5 g/cm³.

11. The fine carbon fiber/metal composite material according to claim 1, which has a density of at least 2.3 to 5.0 g/cm³.

12. A process for producing the fine carbon fiber/metal composite material of claim 8, which comprises pre-heating a molded product containing fine carbon fibers having a fiber diameter of from 0.5 to 500 nm and a fiber length of at most 1,000 μm and having a hollow-structured central axis in an inert atmosphere, and then pressure impregnating the molded product with a molten metal of aluminum, magnesium, copper or an alloy of such a metal by molten metal forging by using a pressing apparatus under a pressure of at least 20 MPa per unit area of a punch.

* * * * *